(12) United States Patent
Garlepp (10) Patent No.: US 7,254,797 B2
(45) Date of Patent: Aug. 7, 2007

(54) INPUT/OUTPUT CELLS WITH LOCALIZED CLOCK ROUTING

(75) Inventor: Bruno W. Garlepp, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 388 days.

(21) Appl. No.: 10/956,471

(22) Filed: Sep. 30, 2004

(65) Prior Publication Data

US 2006/0071691 A1 Apr. 6, 2006

(51) Int. Cl.
*G06F 17/50* (2006.01)

(52) U.S. Cl. .......................... 716/10; 716/12
(58) Field of Classification Search ............. 716/1, 716/8–12; 326/41
See application file for complete search history.

(56) References Cited

U.S. PATENT DOCUMENTS

| | | | |
|---|---|---|---|
| 6,204,690 B1 | | 3/2001 | Young et al. |
| 6,542,096 B2 * | | 4/2003 | Chan et al. ................. 341/100 |
| 6,701,506 B1 * | | 3/2004 | Srinivasan et al. ........... 716/10 |
| 6,703,860 B1 * | | 3/2004 | Agrawal et al. .............. 326/41 |
| 6,754,877 B1 * | | 6/2004 | Srinivasan ..................... 716/2 |
| 6,823,502 B2 * | | 11/2004 | Wingren et al. ............... 716/9 |

OTHER PUBLICATIONS

Sebastian Smith, Michael John, "Application-Specific Integrated Circuits." Copyright 1997 by Addison Wesley Longman, Inc. pp. Cover, publication, 853-899.

\* cited by examiner

*Primary Examiner*—Jack Chiang
*Assistant Examiner*—Binh Tat
(74) *Attorney, Agent, or Firm*—Silicon Edge Law Group LLP; Arthur J. Behiel (57) ABSTRACT

Described are approaches to routing buffered reference clock signals to a plurality of input/output (I/O) cell instances on an integrated circuit (IC) die. All or a subset of the I/O cell instances include clock routing resources optimized to deliver high-speed, low jitter clock signals within and through the particular instance. The clock routing resources in physically adjacent instances of the input/output cells for a given IC die automatically interconnect, collectively forming clock routing infrastructure optimized for groups of cell instances. This modular approach to clock routing simplifies the task of combining I/O cell instances with other I/O cell instances and with other types of circuitry.

28 Claims, 4 Drawing Sheets

INPUT/OUTPUT CELLS WITH LOCALIZED CLOCK ROUTING

FIELD OF THE INVENTION

The present invention relates generally to the field of communications, and more particularly to high speed electronic signaling within integrated circuit devices.

BACKGROUND

Application-specific integrated circuits, or "ASICs," are circuits designed to satisfy the requirements of a particular electronic system. In designing an ASIC, circuit configurations that perform the required function are entered into an ASIC design system using either a hardware description language (HDL) and/or a schematic entry tool. HDLs represent circuits as lines of code, while schematic entry tools represent circuits using interconnected symbols that represent simple or complex analog or logic functions. In either case, the components used to implement the circuit design are chosen from a library of ASIC cells that represent simple or complex operations. (ASIC "cells" are alternatively referred to as modules, blocks, macros, etc.) The resulting designs are typically expressed in some form of hardware description language, from which they are synthesized to produce a "netlist," a file that contains a description of all the components and interconnections in the circuit design, or a portion of the circuit design. Netlists are conventionally stored on computer-readable media, such as magnetic tapes or computer disks.

The function and speed performance of ASIC cells, or "circuit cells," are typically well characterized. Conventional design tools called logic and circuit simulators use custom test vectors and functional and timing information from the netlist to predict whether a circuit made in conformity with the netlist description will function correctly. Next, a place-and-route tool is employed to define the physical placement of cell instances and their interconnections on a semiconductive material, such as a semiconductor wafer or die. Wafer dicing may be employed to create individual semiconductor die.

Modern circuit designs are often far too complex to be designed by a single engineer or even a single team of engineers. Design specifications for complex circuit designs are therefore defined hierarchically as a collection of functional blocks. Rather than "reinvent the wheel" for every functional block of a given circuit design, IC manufactures often purchase intellectual-property (IP) cores that fully characterize the contents of a given functional block. An IC manufacturer might purchase IP cores that define, for example, an arithmetic logic unit, a memory array, a microcontroller, or an interface circuit, to name but a few examples. All of the blocks that define the function of a complete IC are compiled into a single netlist and are provided to another design team for placing and routing.

Figure 1:
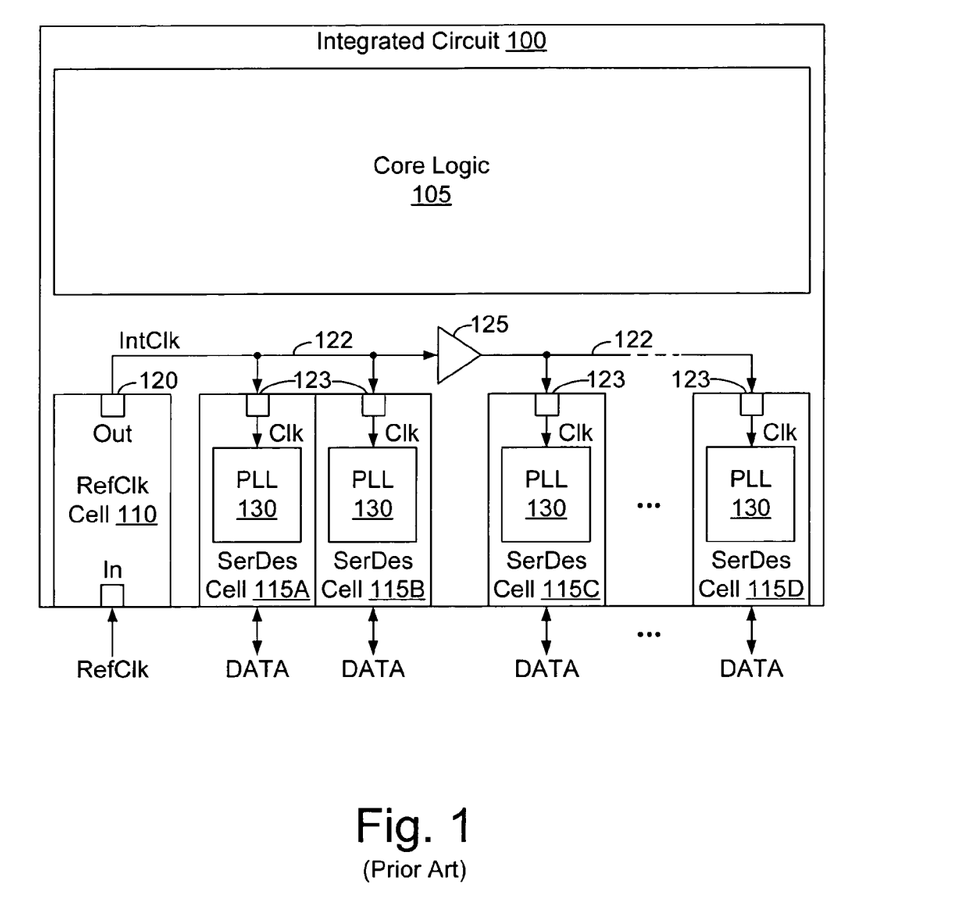
FIG. 1 (prior art) depicts a hypothetical floorplan of an IC 100 that includes some undescribed core logic 105, an instance of a reference clock cell 110, and a plurality of serializer/deserializer (SerDes) cell instances 115A-115D.

FIG. 1 (prior art) depicts a hypothetical floorplan of an IC 100 that includes some undescribed core logic 105, an instance of a reference clock cell 110, and a plurality of serializer/deserializer (SerDes) cell instances 115A-115D. For the sake of brevity, most of the routing is not shown, but a clock path 122 from an output port 120 of reference clock cell 110 extends directly to the respective clock input ports 123 of SerDes cell instances 115A and 115B, and by way of a clock buffer 125 to the respective clock input ports 123 of SerDes cell instances 115C and 115D. Clock path 122 and reference buffer 125 are part of the general routing, and are physically outside the boundaries of instances 110 and 115A-D.

FIG. 1 is illustrative; in practice, intra-block routing is vastly more complex. Not only are there a great many signal paths to define on a limited area, but the signal paths must often be manipulated by hand to solve timing problems and to improve circuit performance. This is particularly true in the example given in which the routed signal is a high-speed reference clock that must be delivered to each SerDes cell instance 115A-115D with minimal phase noise. Routing is therefore an iterative process of routing, simulating, troubleshooting, and rerouting. To make matters worse, the type and criticality of routing often depends upon the needs of particular cells, the contents of which may not be understood by those charged with placing and routing instances of those cells. In the example of FIG. 1, SerDes cell instances 115A-115D are exceptionally high-speed input/output circuits that require high-speed differential clock signals and that are very sensitive to phase noise. Customers less familiar with the needs of such cells and the design of high-speed clocking infrastructure are understandably concerned about meeting the clocking requirements of sensitive, high performance circuits.

In a particular example, Rambus Inc. of Los Altos, Calif., designs SerDes cells implemented as "quads" with one, two, or four phase-locked loops (PLLs) or multiplying delay-locked loops (MDLLs) and associated interpolator clock and data recovery (CDR) circuitry to support the operation of SerDes lanes. In the depicted example, SerDes cell instances 115A-115Ds require input reference clock signals IntClk for use by PLL 130 in generating high-speed transmit and receive clock signals (not shown). The routing of these reference clock signals from the circuit board on which the ASIC is placed or attached, optionally through reference buffer cell 125, to one or more cell instances has been very complicated and application specific. Both Rambus and their customers have been concerned about how the reference clocks are buffered, what power supplies are used for the buffers, and how the reference clocks are shared throughout the chip. A simplified and more robust approach is needed for reliable reference clock routing.

BRIEF DESCRIPTION OF THE DRAWINGS

The present invention is illustrated by way of example, and not by way of limitation, in the figures of the accompanying drawings and in which like reference numerals refer to similar elements and in which:

FIG. 2 depicts an IC die 200 in accordance with one embodiment. Die 200 includes a plurality of SerDes cell instances 205, an instance of a reference clock cell 210, and some core logic 215.

DETAILED DESCRIPTION

The following disclosure details an approach to routing buffered reference clock signals to a plurality of input/output cell instances—instances of serializer/deserializer (SerDes) cells in one embodiment—on an integrated circuit (IC) die. All or a subset of the input/output cell instances include clock routing resources optimized to deliver high-speed, low jitter clock signals within and through the particular cell instance. The clock routing resources in physically adjacent instances of the input/output cells for a given IC die automatically or nearly automatically interconnect, collectively forming clock routing infrastructure optimized for groups of input/output cell instances. This pre-routed, modular approach to clock routing simplifies the task of combining the input/output cell instances with instances of other like cells and other types of cells.

Figure 2:
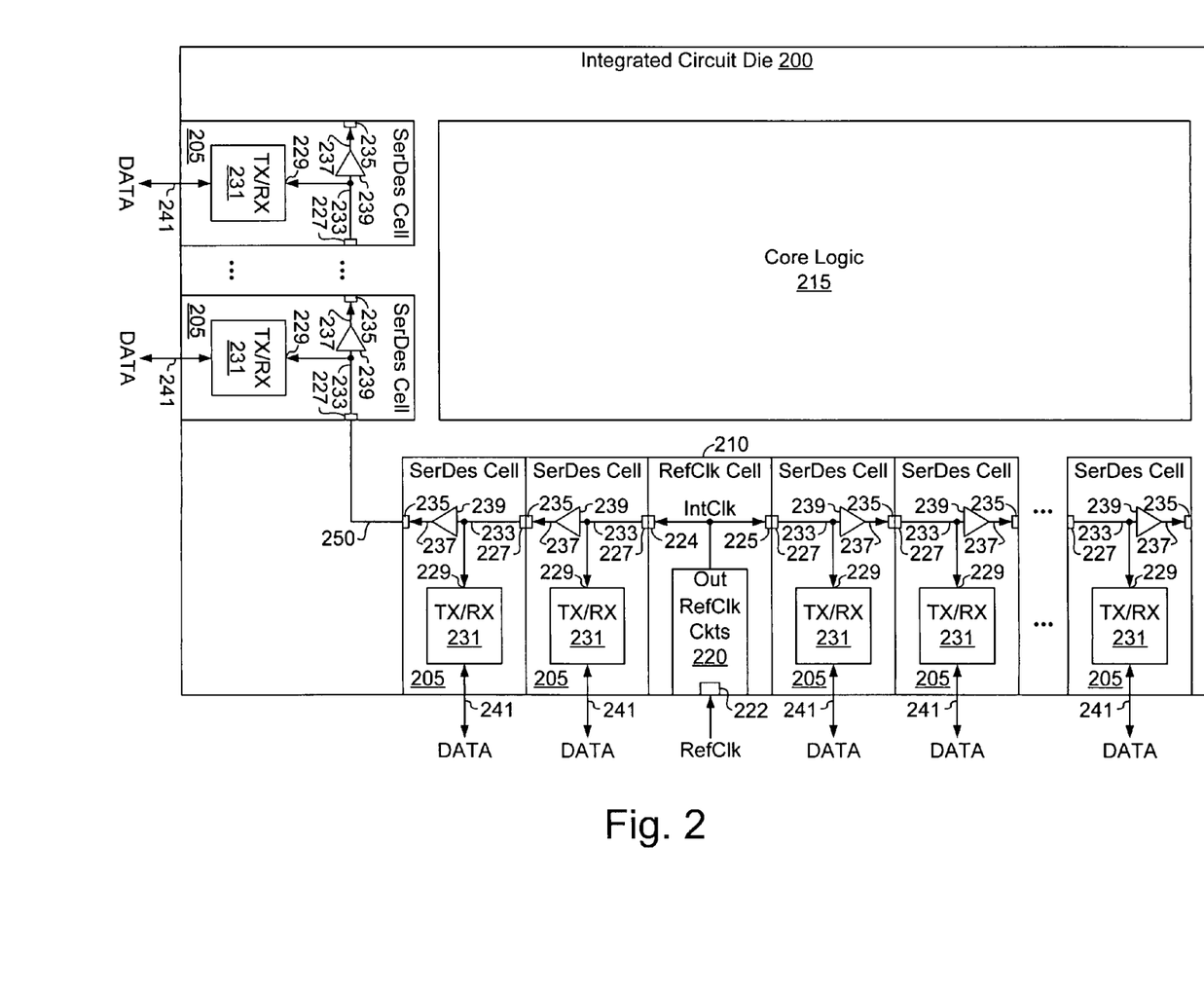

FIG. 2 depicts an IC die 200 in accordance with one embodiment. Die 200 includes a plurality of SerDes cell instances 205, an instance of a reference clock cell 210 (a reference clock instance), and some core logic 215. Core logic 215 could be any of myriad circuit types or combinations of circuit types that communicate with external components via instances 205. Core logic 215 might include, for example, standard circuitry defined in an ASIC cell library, custom cells, or a combination of standard and custom cells. Typical core logic includes, for example, graphics processors, network processors, and switching arrays, to name just a few of myriad possibilities.

Each SerDes instance 205 receives an internal reference clock signal IntClk from reference clock instance 210, which derives internal reference clock IntClk from an externally provided reference clock signal RefClk (the terms "internal" and "external" are to be interpreted with respect to die 200). Instead of leaving the customer to route internal reference clock signal IntClk in a separate routing channel, as in the example of FIG. 1, SerDes instances 205 include the requisite clock routing infrastructure to convey the internal clock signal IntClk across die 200. In the depicted example, instances 205 are defined by two SerDes cells, one to support each of two directions of clock-signal propagation. The first SerDes cell defines a plurality of identical instances 205 that convey clock signal IntClk to the right, while the second SerDes cell defines a plurality of identical instances 205 that convey clock signal IntClk to the left. In other embodiments, a single SerDes cell defines circuitry capable of routing clock signals to traverse the corresponding instances in two or more directions. Cells in accordance with some embodiments can be flipped so that instances mirroring one another can convey signals in different directions depending upon the orientation of the cells. In such cases, only one type of SerDes cell needs to be defined.

Reference clock circuitry 220 of reference clock instance 210 receives external reference clock signal RefClk via a reference clock node 222. Reference clock circuitry 220 derives internal reference clock IntClk from reference clock RefClk and conveys the resulting signal to a pair of reference clock ports 224 and 225. The cell area of reference clock instance 210 is defined within a bounding box, or footprint, confining the components of reference clock instance 210. The term "bounding box" does not necessarily refer to a physical structure, but is a term of art that describes the smallest area that encloses all the geometry of an instance of a given cell (e.g., instances 205 and 210). Reference clock circuitry 220 might include, for example, a phase-locked loop (PLL), a delay-locked loop (DLL), a multiplying delay-locked loop (MDLL), a clock buffer, a level converter, or some combination of two or more such elements. Many methods of generating an internal clock signal from an external reference clock are available and are well known to those of skill in the art. In one example, external reference clock signal RefClk is a 100 MHz, 125 MHz, 250 MHz, or 500 MHz differential clock signal that drives PLL and differential driver circuitry in reference clock circuitry 220 to produce a corresponding, buffered, 625 MHz, small-swing, differential clock signal IntClk.

Each SerDes instance 205 includes a clock input port 227 coupled to a clock node 229 of a transceiver 231 via a first clock path 233. Clock input port 227 is also coupled to a clock output port 235 via a second clock path 237, which may include a clock buffer 239. Transceiver 231 may support bi-directional or unidirectional communication 241, which may be accomplished over one or a collection of bidirectional or unidirectional signal paths. One embodiment of transceiver 231 is detailed below in connection with FIG. 3. In other embodiments, internal clock signal IntClk provides timing information for different types of transceivers, transmitters, or receivers. In other embodiments, an additional clock buffer (not shown) may be disposed between input port 227 and PLL 309, in which case buffer 239 may be omitted. In one such embodiment, the additional clock buffer is disposed between path 233 and PLL 309, but the second buffer might also be connected in series with buffer 239. Still other clock-buffer configurations may be used, as will be evident to those of skill in the art. Some alternative buffer schemes are detailed below in connection with FIGS. 4 and 5.

Figure 3:
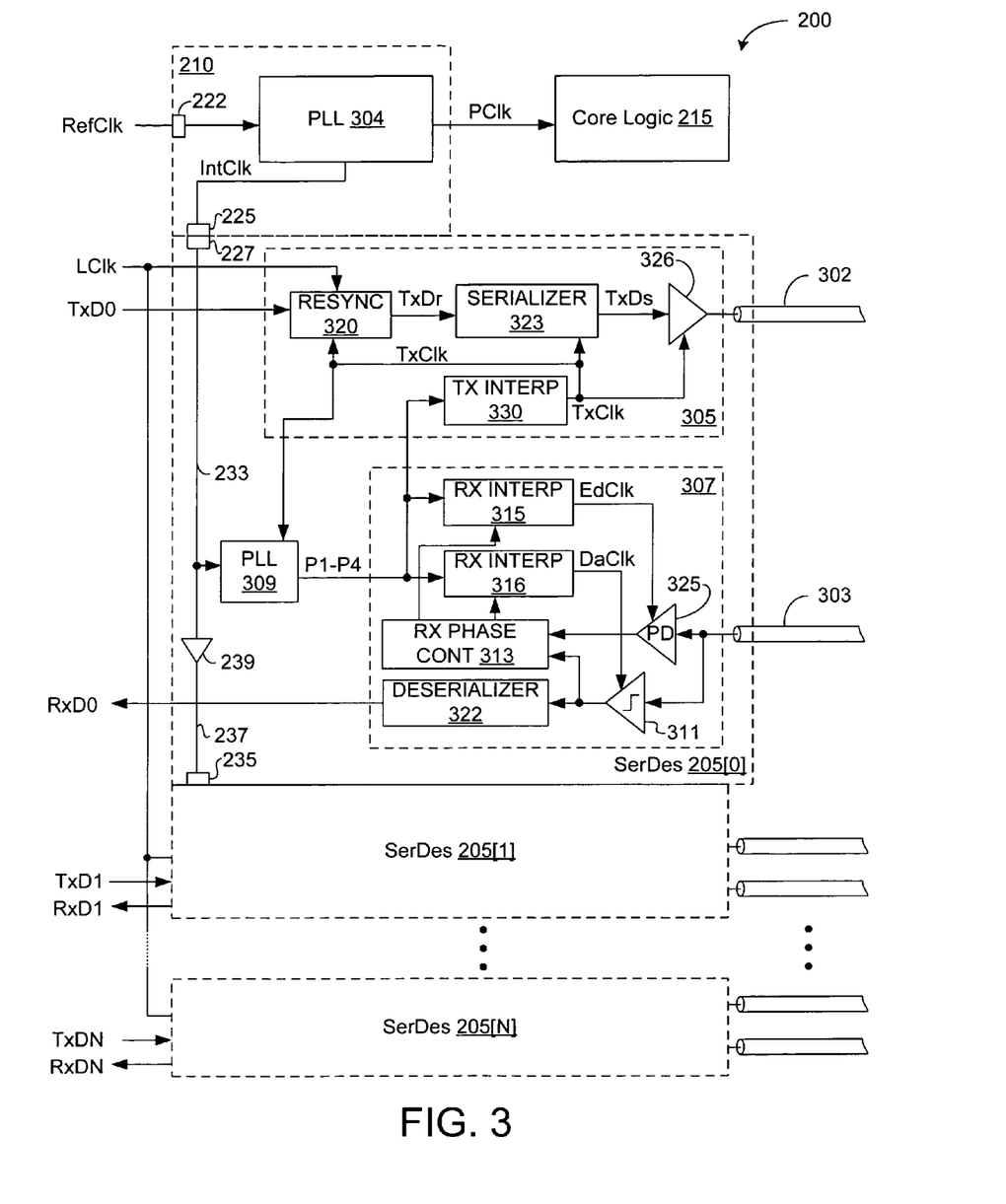
FIG. 3 depicts an embodiment of die 200 of FIG. 2, detailing aspects of SerDes instances 205 in one example.

Each transceiver 305 includes PLL 309 in the depicted embodiment, but one PLL 309 can also be shared among a plurality of transceivers. In the latter case, transmit clock TxClk and phase vectors P1-P4 can be shared, each transceiver deriving edge and data clocks from the respective received signal using the phase vectors. In still other embodiments, the phase vectors alone are shared, in which case one or more of the phase vectors can be used to generate the transmit clock.

The cell defining a given instance 205 physically locates clock input port 227 and clock output port 235 such that corresponding input and output clock ports of abutting, identical instances abut one another. Due to the close physical proximity of the adjacent clock ports, automatic routing that takes place after cell placement interconnects abutting clock signal paths using short, well-characterized conductive vias or segments. Alternatively, abutting instances and their respective ports touch or overlap slightly so that placement automatically interconnects respective output and input clock ports from abutting instances. Provisioning for reference clock routing within each SerDes instance 205 greatly simplifies clock routing, and thus removes much of the burden that might otherwise fall on customers considering the inclusion of instances 205 in a larger IC design. The clock input and output ports of a given instance are defined in the corresponding circuit cell, but may not be evident in a completed integrated circuit. Instead, adjacent ports may appear physically as a continuous conductor extending between cell instances.

Each SerDes instance 205 is shown to include a clock buffer 239. Other embodiments might use more or fewer buffers, as needed. For example, 1. reference clock instance 210 may include one or more buffers;
2. different instances of SerDes cells can include different number or strengths of clock buffers;

3. each SerDes cell may define more or fewer clock buffers, and one or more buffer(s) may precede clock node 229;
4. where included, clock buffers may be adapted to provide selectable drive strength, e.g., by mask programming or the inclusion of a multiplexer in one or more clock paths and controlled by an on-chip register; and
5. clock shield lines can be included in parallel with the clock lines.

Internal clock IntClk can be routed differently than other clock signals conveyed on die 200. All or a subset of SerDes cells can define identical data structures to create identical instances on a semiconductor die. Alternatively, different instances, with different numbers or strengths of buffers for example, can be defined using different data structures. Whatever the configuration of clock routing, SerDes cell designers can optimize the clock routing solution for their SerDes cells without regard to the clock routing provided elsewhere on the die, and without imposing a critical design issue on those responsible for intra-cell routing.

In some embodiments, buffer 239 in one or more of the SerDes cells may be optimized to drive some additional intra-cell routing. In the example of FIG. 2, the left-most SerDes instance 205 of the bottom row of SerDes instances connects to an adjacent, though not adjoining, SerDes instance 205 via an intra-cell routing segment 250. Reference clock distribution can thus be extended across gaps between SerDes instances. One or more of buffers 239 can be programmable to provide a plurality of strengths, or different SerDes cells can be available with differently sized buffers. Buffer 239 might also be tri-statable, so that SerDes instances 205 most remote from reference instance 210 might have their buffers deactivated. In addition, buffer 239 can be made strong enough to allow both abutted placement and placement requiring a connection (e.g. connection 250) of up to some maximum length.

The concept of modular interconnection of reference clock signals could also be applied to other signals that run between multiple instantiations (instances) of cells, such as power lines, control lines, and other signal lines. The main benefit of this approach is that it avoids the problem of having to describe to customers exactly how to route sensitive signals between blocks and how to buffer them and power the buffers. The buffers and their power supplies are now fully contained inside SerDes instances 205 (i.e., within their respective bounding boxes) so that the designers of the SerDes cells can control the quality of the internal reference clock, which is critical to SerDes performance.

Some IC design systems allow adjacent cell instances to overlap, though severe overlap is generally disfavored because it can be visually distracting to the designer. Further, though referred to as bounding "boxes" herein, some IC design systems allow irregularly shaped cell boundaries: these too are considered to be bounding boxes.

FIG. 3 depicts a portion of an embodiment of die 200 of FIG. 2, detailing aspects of SerDes instances 205 in one example. Many features of FIG. 3 are common to those of FIG. 2, like-numbered elements being the same or similar. As in FIG. 2, die 200 includes reference clock instance 210 and a plurality of SerDes instances 205[0:N]. Though only one SerDes instance 205 is detailed, N instances 205 support N serial links with associated channels. For brevity, the following discussion is limited to just one SerDes instance 205 [0] and an associated pair of serial communication channels, an outgoing channel 302 and an incoming channel 303.

PLL 304 is similar or identical to reference clock circuit 220 of FIG. 2, and generates intermediate reference clock signal IntClk and a processor clock PClk for core logic 215. Core logic 215 is e.g. a graphics processor. SerDes instance 205[0] includes a transmit section 305, a receive section 307, and a PLL 309 shared by both transmit and receive sections 305 and 307.

Receive section 307 is of a well-known type, and is thus not described in detail. In brief, receive section 307 includes a phase detector 325 and a sampler 311, each of which samples received data from channel 303. Phase detector 325 provides an output signal to a receiver phase controller 313, which controls the sample timing of the received signal via a pair of phase interpolators 315 and 316 that derive edge and data clocks EdClk and DaClk, respectively, by combining selected ones of a plurality of differently phased reference clocks P1-P4 from PLL 309. Sampler 311, thus properly timed, samples the incoming data and provides the resulting sampled data to a deserializer 322 for conversion to parallel input data RxD0, and provides sampled data to phase controller 313. Either or both of PLLs 304 and 309 can be delay-locked loops (DLLs) in other embodiments. (DLLs and PLLs may be referred to generally as locked-loop circuits.)

Transmit section 305 is also of a well-known type, and conventionally includes a resynchronizer 320 that re-times parallel transmit data TxD0 timed to a local clock LClk to transmit clock TxClk. The resulting re-timed parallel data TxDr is then fed to a serializer 323. Serial transmit data TxDs from serializer 323 is then conveyed to a transmitter 326 for transmission over channel 302. A transmit phase interpolator 330 coupled to the output of PLL 309 is included to match the delay of the transmit-clock path with the delay through the PLL feedback loop. An article entitled "Equalization and Clock Recovery for a 2.5-10-Gb/s 2-PAM/4-PAM Backplane Transceiver Cell," by Jared L. Zerbe, et al. (IEEE JSSC, December 2003) details an example of a transceiver similar to transceiver 305 but employing a different clock architecture, and is incorporated herein by reference.

Figure 4:
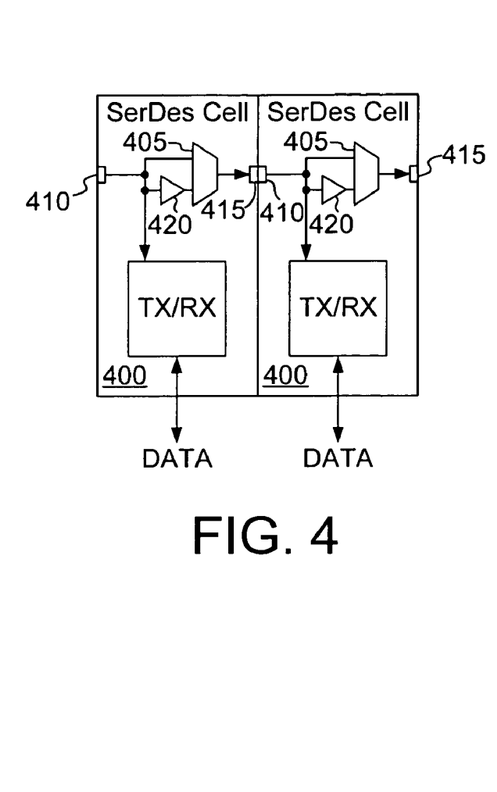
FIG. 4 depicts a pair of adjacent, identical SerDes cell instances 400 in accordance with another embodiment.

FIG. 4 depicts a pair of adjacent, identical SerDes cell instances 400 in accordance with another embodiment. Each cell instance 400 includes a multiplexer 405 that can be programmed to select passing clock signals from an input clock port 410 directly to an output clock port 415 or through a buffer 420. Identical instances of SerDes cell instances 400 can be used with or without inclusion of the buffer in the clock path. The selection of multiplexer 405 can be accomplished using a number of well-known programming technologies, including an overlay cell or an on-chip register, to name just a few. Additional buffers and associated selection circuitry can be included to provide more flexibility in adjusting buffer drive strength as needed for a given load.

Figure 5:
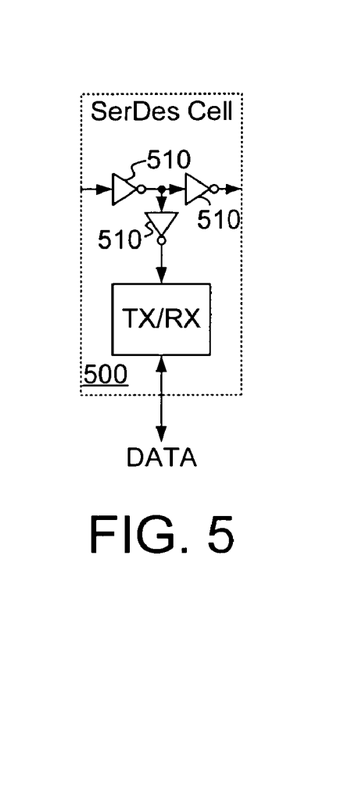
FIG. 5 depicts a SerDes cell instance 500 in accordance with yet another embodiment.

FIG. 5 depicts a SerDes cell instance 500 in accordance with yet another embodiment. The example of FIG. 5 illustrates that inverters can be used instead of, or in addition to, non-inverting clock buffers. In this instance, three inverting clock buffers 510 are included. This embodiment also illustrates three possible placement options for programmable or fixed clock buffers.

Figure 6:
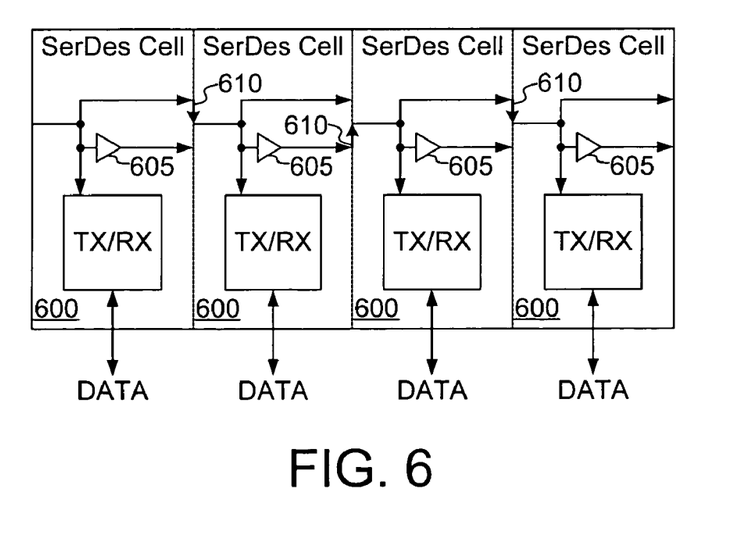
FIG. 6 depicts a number of adjacent, identical SerDes cell instances 600 in accordance with another embodiment.

FIG. 6 depicts a number of adjacent, identical SerDes cell instances 600 in accordance with another embodiment. Each SerDes cell instance 600 includes a pair of inter-cell clock paths, one with and one without a buffer 605, that traverse the instance from the left edge to the right edge of the respective bounding box. Mask options 610 can then be defined in the final layout to include or omit clock buffers as desired. Additional buffers and associated selection circuitry can be included to provide more flexibility in adjusting buffer drive strength as needed for a given load.

The final output of the design process for an integrated circuit is normally a computer-readable medium, typically a computer disk or magnetic tape, encoded with data structures defining the circuitry to be physically instantiated as in integrated circuit. These data structures are commonly written in Caltech Intermediate Format (CIF) or GDSII, a proprietary binary format. Those of skill in the art of mask preparation can develop such data structures from schematic diagrams of the type detailed above.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Whether a given signal is an active low or an active high will be evident to those of skill in the art.

While the present invention has been described in connection with specific embodiments, variations of these embodiments will be obvious to those of ordinary skill in the art. For example, embodiments of the invention may be adapted for use with multi-pulse-amplitude-modulated (multi-PAM) signals, or for use with other signaling schemes. The invention can also be used for assembling signal interfaces comprising cells other than SerDes cells. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. Section 112.

What is claimed is:

1. An input/output (I/O) cell for use in combination with a plurality of additional library cells to form a netlist description of an integrated circuit, the (I/O) cell defined by code comprising:
   a. data specifying a clock input port at a first location within a bounding box of the I/O cell, wherein the bounding box describes a smallest area that encloses the I/O cell;
   b. data specifying a clock output port at a second location within the bounding box of the I/O cell, wherein the first location in a first instance of the I/O cell abuts the second location in an abutting second instance of the I/O cell;
   c. data specifying a first clock path adapted to convey a clock signal through the I/O cell from the clock input port to the clock output port;
   d. data specifying I/O circuitry, including a locked-loop circuit coupled to the clock input port;
   e. data specifying a second clock path adapted to convey the clock signal from the clock input port to the I/O circuitry; and
   f. data specifying at least one buffer disposed in at least one of the first and second clock paths.

2. The I/O cell of claim 1, wherein the data specifying the at least one buffer specifies the at least one buffer as having a select port.

3. The I/O cell of claim 1, wherein the at least one buffer is disposed between the clock input port and the clock output port.

4. The I/O cell of claim 3, wherein the at least one buffer is disposed between the clock input port and the I/O circuitry.

5. The I/O cell of claim 1, wherein at least one of the additional library cells is a reference clock cell having a reference clock output port at a third location abutting the first location when an instance of the reference clock cell abuts an instance of the I/O cell.

6. The I/O cell of claim 1, wherein the first and second locations overlap in abutting instances of the cell.

7. A computer-readable medium having a netlist description of a circuit, the netlist description suitable for use in a process for forming an integrated circuit on a layer of a seiniconductive material, the netlist description comprising:
   a. computer-readable code defining a plurality of library cells; and
   b. computer-readable code defining at least two input/output (I/O) cell instances, wherein each I/O) cell instance comprises:
      i. a clock input port at a first location within a bounding box of the I/O cell instance, wherein the bounding box describes a smallest area that encloses the I/O cell instance;
      ii. a clock output port at a second location within the bounding box of the I/O cell1 instance, wherein the first and second locations abut in abutting instances of the I/O cell instance;
      iii. a first clock path adapted to convey a clock signal through the I/O cell instance from the clock input port to the clock output port;
      iv. I/O circuitry, including a locked-loop circuit coupled to the clock input port;

v. a second clock path adapted to convey the clock signal from the clock input port to the I/O circuitry; and vi. at least one buffer disposed in at least one of the first and second clock paths.

8. The computer-readable medium of claim 7, wherein the at least one buffer has a select port.

9. The computer-readable medium of claim 7, wherein the at least one buffer is disposed between the clock input port and the clock output port.

10. The computer-readable medium of claim 9, wherein the at least one buffer is disposed between the clock input port and the I/O circuitry.

11. The computer-readable medium of claim 7, wherein at least one of the library cells is a reference clock cell, and wherein an instance of the reference clock cell includes a reference clock output port at a third location abutting the first location when the instance of the reference clock cell abuts one of the instances of the I/O cell.

12. The computer-readable medium of claim 7, wherein the first and second locations overlap in abutting instances of the I/O cell.

13. An integrated circuit comprising:
a. first cell instance disposed within a first bounding box, wherein the first bounding box describes a first smallest area that encloses the first cell instance, the first cell instance including:
 i. a first clock input port located within the first bounding box;
 ii. a first clock output port located within the first bounding box;
 iii. a first buffer located within the first bounding box and having a first buffer input terminal and a first buffer output terminal;
 iv. a first conductive strip located within the first bounding box and extending between the first clock input port and the first buffer input terminal;
 v. a second conductive strip located within the first bounding box and extending between the first buffer output terminal and the first clock output port;
 vi. first locked-loop circuitry located within the first bounding box and having a first clock terminal; and
 vii. a third conductive strip located within the first bounding box and extending between the first clock input port and the first clock terminal of the first locked-loop circuitry; and
b. a second cell instance disposed with a second bounding box, wherein the second bounding box describes a second smallest area that encloses the second cell instance, the second bounding box located adjacent the first bounding box, the second cell instance comprising the same circuit elements as the first cell instance including:
 i. a second clock input port located within the second bounding box;
 ii. a second clock output part located within the second bounding box;
 iii. a second buffer located within the second bounding box and having a second buffer input terminal and a second buffer output terminal;
 iv. a fourth conductive strip located within the second bounding box and extending between the second clock input port and the second buffer input terminal;
 v. a fifth conductive strip located within the second bounding box and extending between the second buffer output terminal and the second clock output port;
 vi. second locked-loop circuitry located within the second bounding box and having a second clock terminal; and
 vii. a sixth conductive strip located within the second bounding box and extending between the second clock input port and the second clock terminal of the second locked-loop circuitry.

14. The integrated circuit of claim 13, wherein at least one of the first and second buffers is disableable.

15. The integrated circuit of claim 14, further comprising a third cell instance adjacent the first cell instance and having a global clock port adapted to receive an external reference clock signal and to derive, from the global reference clock signal, an internal clock signal.

16. The integrated circuit of claim 15, the third cell instance including an internal reference clock node coupled to the first clock input port.

17. The integrated circuit of claim 13, wherein the locked-loop circuitry is a phase-locked loop.

18. The integrated circuit of claim 13, wherein the first and second bounding boxes abut one another.

19. The integrated circuit of claim 13, wherein the first clock output port is coupled to the second clock input port.

20. The integrated circuit of claim 19, wherein the first clock output port is coupled to the second clock input port via a third cell instance having the same circuit elements as the first and second instances.

21. The integrated circuit of claim 13, wherein the third conductive strip within the first bounding box extends between the first clock input port and the first clock terminal of the first locked-loop circuitry via the first buffer.

22. The integrated circuit of claim 21, wherein a sixth conductive strip located within the second bounding box extends between the second clock input port and the second clock terminal of the second locked-loop circuitry via the second buffer.

23. A method of routing a clock path of an integrated circuit, the method comprising:
a. creating a first data structure defining a functional block, the data structure specifying:
 i. a clock input port;
 ii. a clock output port;
 iii. a buffer having a buffer input terminal sad a buffer output terminal;
 iv. a first conductive strip extending between the clock input port and the buffer input terminal;
 v. a second conductive strip extending between the buffer output terminal and the clock output port;
 vi. locked-loop circuitry having a clock terminal;
 vii. a third conductive strip extending between the clock input port and the clock terminal of the locked-loop circuitry; and
 viii. a bounding box encompassing elements i-vii, wherein the bounding box describes a smallest area that encloses elements i-vii;
b. incorporating the first data structure into a second data structure, the second data structure specifying a first physical location for a first instance of the functional block and a second physical location for a second instance of the functional block;
c. forming the first and second instances on a semiconductor at the specified first and second physical locations; and d. routing a connection between the clock output port of the first instance and the clock input port of the second instance.

24. The method of claim 23, wherein the first and second instances abut one another.

25. The method of claim 23, further comprising disabling the buffer in at least one of the first and second instances.

26. The method of claim 23, wherein the bounding boxes of the first and second instances overlap one another.

27. The method of claim 23, wherein the third conductor strip extends between the clock input port and the clock terminal of the lock-loop circuitry via the buffer.

28. The method of claim 23, wherein the third conductor strip extends between the clock input port and the clock terminal of the lock-loop circuitry via a second buffer.

* * * * *